United States Patent
Arsovski et al.

(10) Patent No.: US 8,302,037 B2
(45) Date of Patent: Oct. 30, 2012

(54) SKEWED DOUBLE DIFFERENTIAL PAIR CIRCUIT FOR OFFSET CANCELLATION

(75) Inventors: Igor Arsovski, Essex Junction, VT (US); Anthony R Bonaccio, Essex Junction, VT (US); Hayden (Clay) Cranford, Jr., Raleigh, NC (US); Joseph A Iadanza, Essex Junction, VT (US); Pradeep Thiagarajan, Essex Junction, VT (US); Sebastian T Ventrone, Essex Junction, VT (US); Benjamin T Voegeli, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 286 days.

(21) Appl. No.: 12/494,642

(22) Filed: Jun. 30, 2009

(65) Prior Publication Data

US 2009/0261882 A1 Oct. 22, 2009

Related U.S. Application Data

(63) Continuation of application No. 11/931,626, filed on Oct. 31, 2007, now Pat. No. 7,770,139, which is a continuation-in-part of application No. 11/613,516, filed on Dec. 20, 2006, now Pat. No. 7,362,138.

(51) Int. Cl.
*G06F 17/50* (2006.01)
(52) U.S. Cl. .................................................. 716/100
(58) Field of Classification Search .................. 716/100, 716/137, 138; 327/307
See application file for complete search history.

(56) References Cited

U.S. PATENT DOCUMENTS

| | | | |
|---|---|---|---|
| 6,040,710 A | 3/2000 | Nakauchi | |
| 6,472,903 B1 | 10/2002 | Veenstra et al. | |
| 6,624,688 B2 * | 9/2003 | Jaussi et al. | 327/552 |
| 6,937,080 B2 | 8/2005 | Hairapetian | |
| 7,038,495 B2 | 5/2006 | Choi | |
| 7,061,269 B1 | 6/2006 | Agrawal et al. | |
| 7,061,273 B2 | 6/2006 | Wang et al. | |
| 7,161,752 B1 * | 1/2007 | Cheng | 360/46 |
| 7,215,143 B1 | 5/2007 | Chung et al. | |
| 2001/0002796 A1 | 6/2001 | El-Ayat | |
| 2002/0003435 A1 | 1/2002 | Andrews et al. | |

OTHER PUBLICATIONS

Musicer, Jason, and Rabaey, Jan, "MOS Current Mode Logic for Low Power Mixed-Signal Digital Circuits," Jan. 2000.
Musicer, Jason, "An Analysis of MOS Current Logic for Low Power and High Performance Digital Logic," M.S. 2000 (advisor: Jan Rabaey).

(Continued)

*Primary Examiner* — Vuthe Siek
(74) *Attorney, Agent, or Firm* — David A. Cain

(57) ABSTRACT

A differential system producing differential signals with offset cancellation utilizing a double differential input pair system is disclosed. It uses two parallel differential transistor pairs which are intentionally skewed. Nominally, the differential pairs are skewed in opposite direction from each, but with equal magnitude, so that the combination of the two differential pairs is nominally balanced. The current through each differential pair is then increased or decreased until any offset is sufficiently cancelled, using a selection means for providing an equi-potential value to first and second differential inputs in a calibration mode of the system and a comparison means for comparing first and second differential outputs in a calibration mode to determine the offset of the system.

5 Claims, 3 Drawing Sheets

OTHER PUBLICATIONS

Mizuno, Masayuki, Yamashina, Masakazu, Furuta, Koichiro, Igura, Hiroyuki, Abiko, Hitoshi, Okabe, Kazuhiro, Ono, Atsuki, and Yamada, Hachiro, "A GHz MOS Adaptive Pipeline Technique Using MOS Current-Mode Logic," IEEE Journal of Solid-State Circuits, vol. 3, No. 6, pp. 784-791, Jun. 1996.

Wong, Derek C., de Micheli, Giovanni, Flynn, Michael J., "Designing High-Performance Digital Circuits Using Wave Pipelining: Algorithms and Practical Experiences," IEEE Transactions on Computer-Aided Design of Integrated Circuits and Systems, vol. 12, No. 1, pp. 25-46, Jan. 1993.

U.S. Appl. No. 11/613,516, filed Dec. 20, 2006, titled "Flexible Multimode Logic Element for Use in a Configurable Mixed-Logic Signal Distribution Path," Igor Arsovski, Anthony R. Bonaccio, Hayden C. Cranford, Jr., Joseph A. Iadanza, Pradeep Thiagarajan, Sebastian T. Ventrone.

U.S. Appl. No. 11/670,537, filed Feb. 2, 2007, titled "Flexible Multimode Logic Element for Use in a Configurable Mixed-Logic Signal Distribution Path," Igor Arsovski, Anthony R. Bonaccio, Hayden C. Cranford, Jr., Joseph A. Iadanza, Pradeep Thiagarajan, Sebastian T. Ventrone.

U.S. Appl. No. 11/848,470, filed Aug. 31, 2007, titled "Design Structure for a Flexible Multimode Logic Element for Use in a Configurable Mixed-Logic Signal Distribution Path," Igor Arsovski, Anthony R. Bonaccio, Hayden C. Cranford, Jr., Joseph A. Iadanza, Pradeep Thiagarajan, Sebastian T. Ventrone.

* cited by examiner

SKEWED DOUBLE DIFFERENTIAL PAIR CIRCUIT FOR OFFSET CANCELLATION

CROSS REFERENCE TO RELATED APPLICATIONS

This U.S. patent application is related to U.S. patent application Ser. No. 11/931,626 filed Oct. 31, 2007, titled "DESIGN STRUCTURE FOR A FLEXIBLE MULTI-MODE LOGIC ELEMENT FOR USE IN A CONFIGURABLE MIXED-LOGIC SIGNAL DISTRIBUTION PATH", which is a continuation in part of U.S. Pat. No. 7,362,138B1, Filed Dec. 20, 2006, titled: "FLEXIBLE MULTIMODE LOGIC ELEMENT FOR USE IN A CONFIGURABLE MIXED-LOGIC SIGNAL DISTRIBUTION PATH", and assigned to the present Assignee.

FIELD OF THE INVENTION

The present disclosure generally relates to the field of analog differential amplifiers in integrated circuits. In particular, the present disclosure is directed to a structure of a differential system producing differential signals with offset cancellation utilizing a double differential input pair system, and a method of offset cancellation in a differential system.

BACKGROUND

The use of differential architectures is common in a wide range of circuits including comparators, amplifiers, and current mode logic (CML). One major limitation of differential transistor pairs is offset which results from process, environment, and operation variations. For example, offset in differential transistor pairs can come from threshold voltage mismatch due random dopant variation during fabrication. In some cases, such as silicon-on-insulator (SOI) transistors, offset may also result from changes in body voltage depending on the device operation, in a phenomenon generally referred to as the body history effect. The problem is that inaccuracies in differential circuits result in an output that is incorrect. The inaccuracies result from manufacturing variations, shifts in operation etc.

Historically, offset in differential transistor pairs has been addressed in sensitive circuits by either using larger devices (to average out random variations and thus reduce offset) or by implementing offset cancellation circuitry. However, large transistors have greater parasitic capacitance, which tends to degrade circuit performance, and are costly to manufacture due to the increased area required to produce them.

The known solutions for implementing offset cancellation circuitry tend to degrade circuit performance. One common solution involves using the differential pair in a closed-loop feedback configuration, and storing the offset voltage on a capacitor, which is then inserted in series with one of the inputs, so that the input-referred offset is cancelled. The primary disadvantage of this technique is that the circuit must be stable when in feedback configuration, which generally requires that the maximum operating frequency be reduced significantly. Offset can also be cancelled using open-loop techniques, in which the inputs are typically shorted together and the circuit is iteratively adjusted until the output indicates that the offset has been reduced below a given threshold. However, known open-loop calibration circuit solutions generally require the addition of circuit elements in the signal path, which tends to reduce the maximum operating frequency of the system.

There is a need for robust methods and structures for offset cancellation which do not degrade the performance of the circuit or significantly increase the area consumed by the circuit.

SUMMARY OF THE INVENTION

The current invention overcomes the limitations of the known solutions. Most importantly, there is no fundamental reduction in operating frequency or significant increase in power or area using the proposed offset cancellation technique. In one embodiment, the present disclosure is directed to a structure of a differential system producing differential signals with offset cancellation using two parallel differential transistor pairs which are intentionally skewed. Nominally, the differential pairs are skewed in opposite direction from each other, but with equal magnitude, so that the combination of the two differential pairs is nominally balanced. The current through each differential pair is then increased or decreased until any offset is sufficiently cancelled, using a selection means for providing an equi-potential value to first and second differential inputs in a calibration mode of the system and a comparison means for comparing first and second differential outputs in a calibration mode to determine the offset of the system In another embodiment, the present disclosure is directed to a method of offset cancellation in a differential system comprising a differential circuit including first and second differential input pairs with first and second independent biases, each input differential pair imbalanced with respect to its true and compliment inputs and both input differential pairs imbalanced in opposite polarity with respect to each other; and connecting the true and compliment inputs to the differential system to an equi-potential source in calibration mode; and comparing the output of the differential system to determine the direction of the offset in the calibration mode; and iteratively determining bias values for the first and second differential pairs which substantially cancels the offset in both calibration and functional modes.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION OF THE INVENTION

The present disclosure includes structures and methods related to differential systems with offset cancellation.

Figure 1:
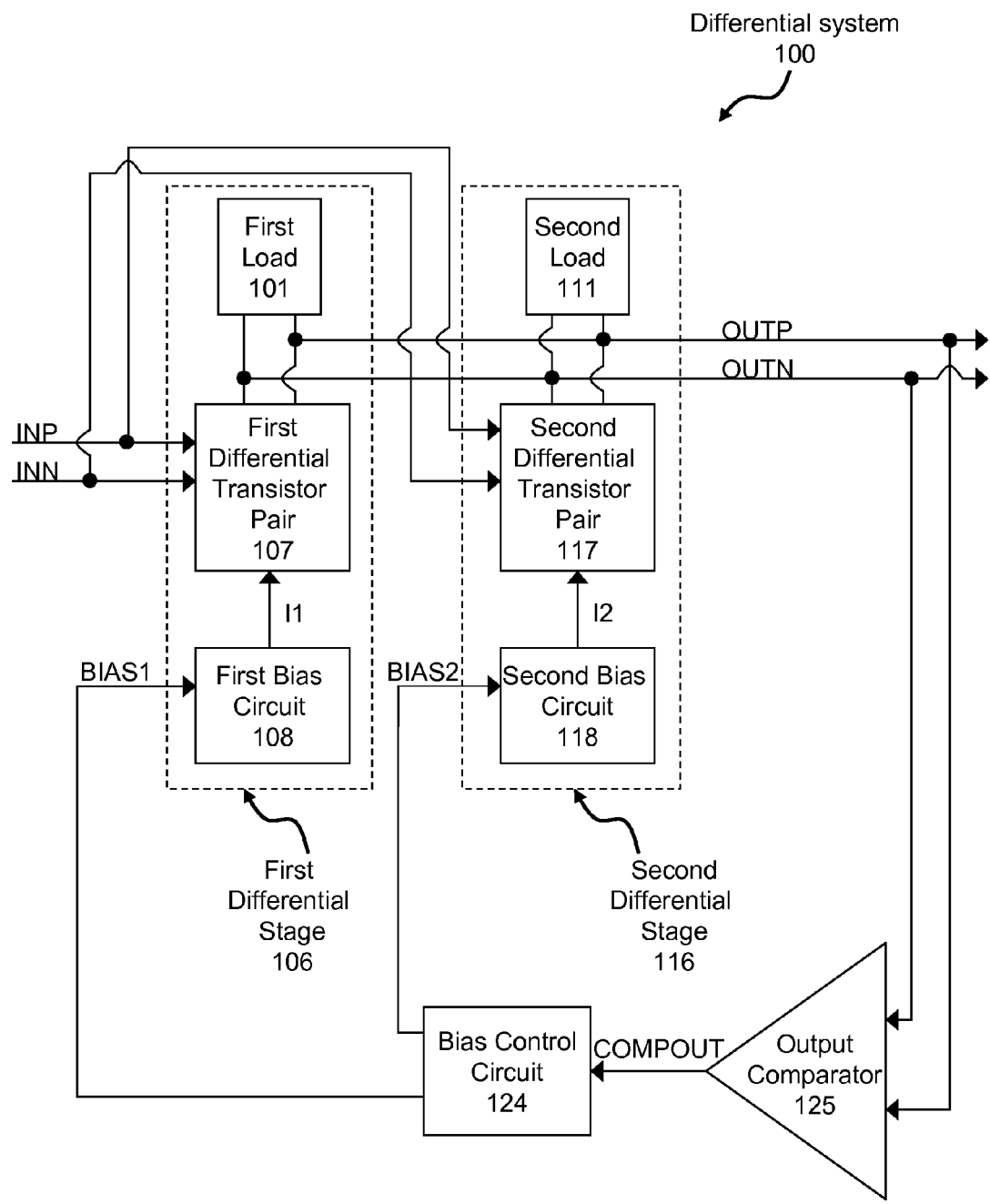
FIG. 1 illustrates a high level block diagram of a differential system 100 according to an exemplary embodiment of the current invention

FIG. 1 illustrates a generalized block diagram of a differential system 100 according to an exemplary embodiment of the current invention. Referring to FIG. 1, differential system 100 consists of a first differential stage 106, a second differential stage 116, a bias control circuit 124, and an output comparator 125. The first differential stage 106 consists of a first differential transistor pair 107, a first bias circuit 108, and a first load 101. The second differential stage 116 consists of a second differential transistor pair 117, a second bias circuit 118, and a second load 111. Within the spirit and scope of the invention, a single load could be implemented instead of two loads 101 and 111, the single load being shared by differential stages 106 and 116. Further, output comparator 125 may be omitted, or incorporated into an additional output circuit stage at the output of differential stages 106 and 116. Additional circuit elements may be also included within the differential system 100. For example, such additional circuitry may include, but is not limited to, additional amplifier stages inserted in the output path of differential stages 106 and 116.

The inputs to differential system 100 are INN and INP. The output of differential system 100 may be either a single ended output OUT or a differential complimentary output consisting of OUTP and OUTN, as shown in FIG. 1. Further, the output COMPOUT of output comparator 125 may serve as an output of the system. The system output is a function of the differential inputs INP and INN. The two differential stages 106 and 116 are connected in parallel as shown in FIG. 1.

During a calibration mode, INN and INP may be connected to a system that provides equi-potential voltages (for example, by temporarily shorting nodes INN and INP to a reference potential through a switch) and the output of output comparator 125 will produce an output COMPOUT that indicates the direction of the input referred offset. During a functional mode they may be connected to a system that provides signals INN and INP as differential inputs. Alternately, the calibration mode may be executed at a time when the functional inputs INN and INP are known to be at an equal potential.

Each differential transistor pair 107 and 117 consists of two devices, a first device controlled by input INP and a second device controlled by input INN. Examples of transistors may include NFET/PFET devices, or NPN/PNP BJT devices, but are not limited strictly to these types and may be any type of transistor known in the art. As the two differential stages are wired in parallel, the input terminal INP of differential transistor pairs 107 and 117 is shared and the input terminal INN of differential transistor pairs 107 and 117 is shared, such that both differential stages 106 and 116 respond in the same direction and manner to changes in the differential input voltages INP and INN. For single-ended output, the OUT terminal of each differential stage is wired together and for differential outputs, the OUTP terminal of both differential stages 106 and 116 is wired together and the OUTN terminal of both differential stages 106 and 116 is wired together. Loads 101 and 111 may consist of transistors and/or resistors, as known in the art.

The device strengths (widths and lengths) chosen in construction of the two differential transistor pairs 107 and 117 provide nominally equivalent weighting of the INP and INN inputs. The device strengths that are selected for each of the devices in each of the differential transistor pairs 107 and 117 is chosen to intentionally skew first differential transistor pair 107 to higher INP sensitivity while the second differential transistor pair 117 is skewed to higher INN sensitivity, or is chosen to intentionally skew differential transistor pair 117 to higher INP sensitivity while the differential transistor pair 107 is skewed to higher INN sensitivity. For example, for strength expressed as device width "W" a first differential transistor pair 107 may have an INP strength of W+x and an INN strength of W, while the second differential transistor pair 117 may have an INP strength of W and an INN strength of W+x, providing an aggregate strength for both INP and INN of 2 W+x. In another example, for strength expressed as device width "W" a second differential transistor pair 117 may have an INP strength of W+x and an INN strength of W, while the first differential transistor pair 107 may have an INP strength of W and an INN strength of W+x, providing an aggregate strength for both INP and INN of 2 W+x. It is noted that the relative strength of the devices in a differential transistor pair may be selected by means other than device width, for example, by device length or by manufacturing parameters such as oxide thickness or ion implantation dose, without departing from the spirit and scope of the present invention.

First bias circuit 108 provides a current I1 to differential transistor pair 107, and is controlled by signal BIAS1 which can be realized as a voltage or current. A second bias circuit 118 provides a current I2 to a second differential transistor pair 117, and is controlled by signal BIAS2 which can be realized as a voltage or current. In an example, either or both bias circuits 108 and 118 may include, but are not limited to, NFET/PFET devices or NPN/PNP BJT devices with the bias control signals directed to the controlling terminals of the transistors (in effect, the gate of an FET device or the base of a BJT device). The output of each of the differential stages 106 and 116 is affected both by the relative INP/INN sensitivity of the differential transistor pairs 107 and 117 and the magnitude of the biasing current I1 and I2 provided by the current sources 108 and 118, respectively. Therefore, the independent current sources in each of the two differential stages coupled with the intentionally skewed differential transistor pairs provides a means of altering the output of each of the two differential stages and by summation, the aggregate output OUT, or, OUTP and OUTN. Within each differential stage, each tail device is controlled independently and the aggregate current (I=I1+I2) need not be held constant. However, in an alternative embodiment, the aggregate current (I=I1+I2) may be maintained at a constant value such that an increase in bias BIAS1 to the first differential stage 106 is accompanied by a decrease in bias BIAS2 to the second differential stage 116, and a decrease in bias to the first differential stage 106 is accompanied by an increase in bias to the second differential stage 116, thereby maintaining the aggregate common mode of the circuit.

In addition to the differential stages 106 and 116 in the circuit, an output comparator 125 is provided to compare the outputs OUTP and OUTN for a differential output circuit or OUT and a provided reference voltage in the case of a single-ended output system. In a calibration mode, inputs INP and INN are forced to an equi-potential value which should ideally result in zero-differential at outputs OUTP, OUTN or in the case of a single ended system, a known voltage. The output comparator 125 checks the output of the differential stages 106 and 116, and determines the direction of the circuit offset. In a basic embodiment, the comparator comprises a differential input, single ended output (digital 1/0 output) stage with offset cancellation previously known in the art, but use of a more complex comparator system for envelope detection/hysteresis or quantification of the offset value falls within the scope of the present disclosure.

Alternatively, output comparator 125 may be omitted, or its function incorporated into an additional output circuit stage. In a non-limiting example, in the case that the output of differential stages 106 and 116 is a single-ended output OUT, comparator 125 may be omitted. In a further non-limiting example, in the case that differential system 100 is a comparator, the output COMPOUT from comparator 125 may serve as the output of differential system 100. In this exemplary case, because the bias control circuit 124 responds to the output COMPOUT of comparator 125, any offset in comparator 125 will be cancelled within the resolution of the system.

Output COMPOUT from output comparator 125 is provided to a bias control means denoted as bias control circuit 124 which adjusts the biases of each of the differential stages 106 and 116 accordingly. In a calibration mode, once the inputs INN and INP are set to an equi-potential value, calibration proceeds by iteratively comparing the voltage of differential outputs OUTP and OUTN, and adjusting the bias signals BIAS1 and BIAS2, hence currents I1 and I2, until the desired comparator result is achieved. With output comparator 125 providing a single output COMPOUT, the desired result may be a switch in output value from 0->1 or 1->0 which approximates offset cancellation within the quantization of the system. In a more complex envelope system, obtaining the desired calibration value may entail determining an envelope and centering the bias control within the envelope. Once the desired result is obtained, calibration is complete, inputs INP and INN are connected to their respective functional-mode sources and the circuit is released from calibration mode.

Figure 2:
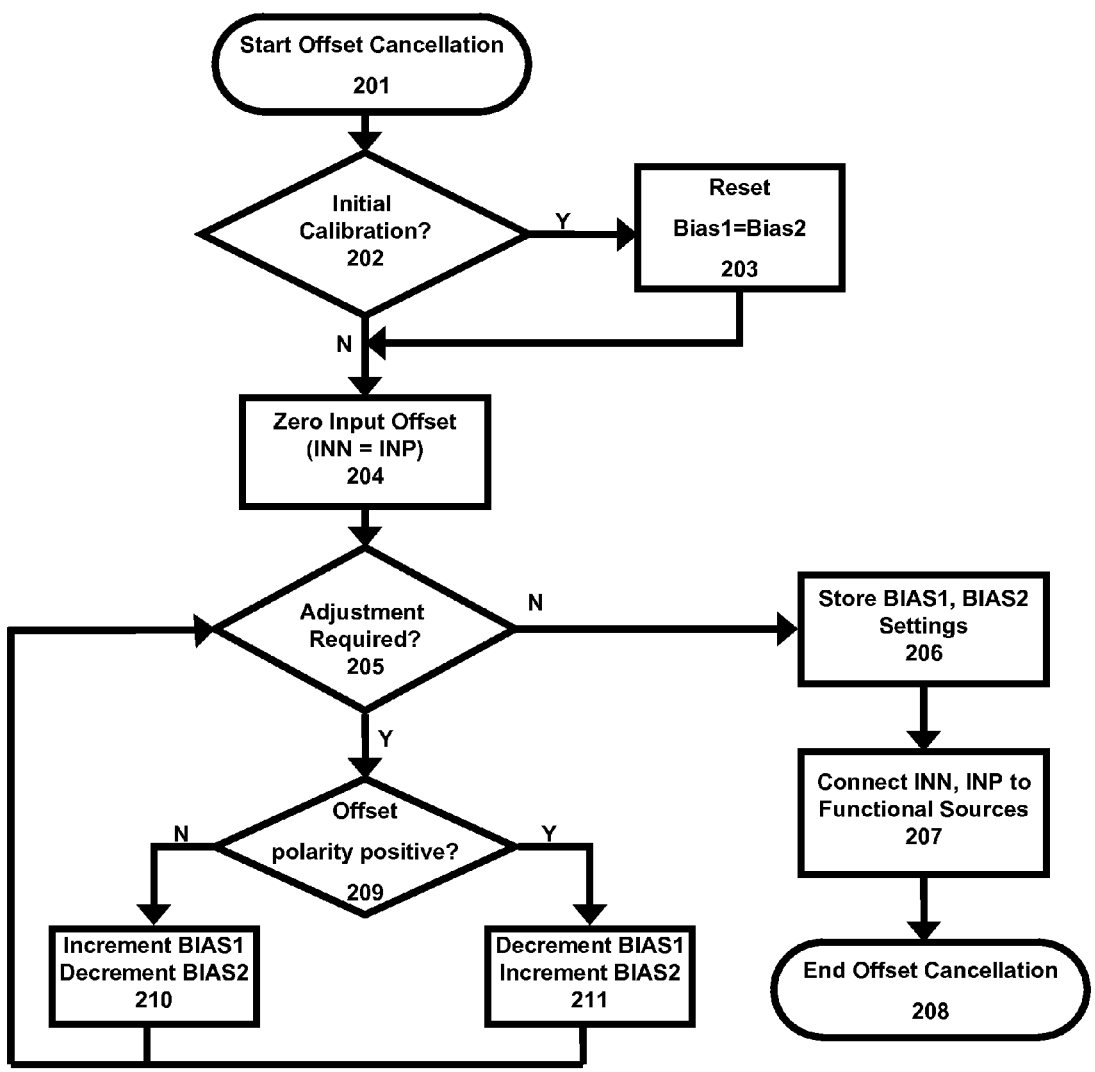
FIG. 2 illustrates a flow chart describing a generalized method for offset cancellation in a differential system.

FIG. 2 illustrates a flow chart describing a generalized calibration method for offset cancellation in the differential system described above. Referring to FIG. 2, offset cancellation begins in block 201. It is determined whether calibration has been initialized in block 202. In the initial calibration step, BIAS1 and BIAS2 are set to be equal during reset in block 203. Subsequently, in block 204, INN and INP are set to equal values in order to achieve zero differential input. In block 205, if an adjustment is required, then the polarity of the offset is determined in block 209, and BIAS1 and BIAS2 are incremented or decremented accordingly in block 210 or block 211. In block 205, if it is determined that no adjustment is required, then in block 206 BIAS1 and BIAS2 values are stored and retained, then inputs INN and INP are connected to functional sources in block 207, and finally calibration is complete in block 208. In a non-limiting example, the decision of block 205 may be based on the state of a counter, such that adjustments proceed for a fixed number of cycles. In a further non-limiting example, the decision of block 205 may be based on the first occurrence of a switch in output state of the system, such that the adjustment process continues until the first time a switch in output state is detected. It is noted that blocks 204 and 207 may be omitted, for example, in the case that the offset cancellation procedure is executed at a time when the functional inputs INN and INP are known to be at an equal potential. It is further noted that the algorithm of FIG. 2 could be amended to provide an alternative end point in which an error code is returned if it is determined that the offset cannot be effectively cancelled by the system. For example, if no switch in the polarity of the offset may be observed in a fixed number of clock cycles, indicating that the offset is too great for the system to cancel, an error may be indicated and the adjustment process terminated.

Figure 3:
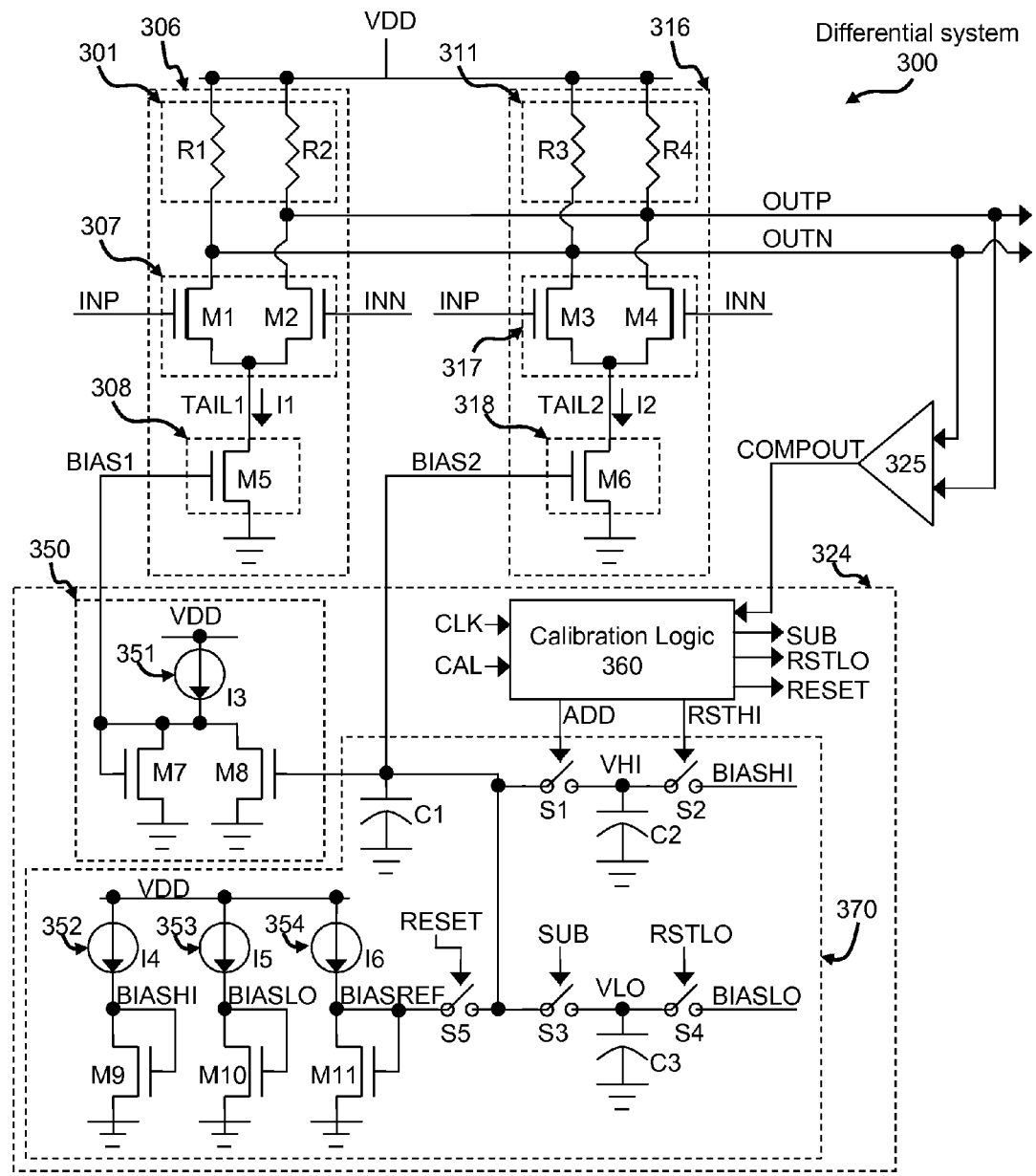
FIG. 3 illustrates a detailed schematic diagram of a specific example of the differential system of FIG. 1.

FIG. 3 illustrates an example implementation of differential system 100 of FIG. 1, now denoted as 300. Referring to FIG. 3, in this example, differential stages 106 and 112 from FIG. 1 are implemented as differential stages 306 and 316 respectively, each having shared complementary differential outputs OUTP and OUTN. In this example, differential transistor pairs 107 and 117 from FIG. 1 are implemented as NFET differential pairs 307 and 317 respectively in FIG. 3, where differential pair 307 consists of transistors M1 and M2, and differential pair 317 consists of M3 and M4. Transistors M1 and M2 are arranged such that their gate terminals are connected to nodes INP and INN respectively, their drain terminals are connected to nodes OUTN and OUTP respectively, their source terminals are connected to node TAIL1. Similarly, transistors M3 and M4 are arranged such that their gate terminals are connected to nodes INP and INN respectively, their drain terminals are connected to nodes OUTN and OUTP respectively, and their source terminals are connected node TAIL2. In this example, device M1 is chosen to have a greater width, and thus a greater transconductance, than transistor M2, resulting in differential stage 306 having greater sensitivity to input INP with respect to input INN. Further, in this example, device M4 is chosen to have a greater width, and thus a greater transconductance, than transistor M3, resulting in differential stage 316 having greater sensitivity to input INN with respect to input INP. Bias circuits 108 and 118 from FIG. 1 are implemented as bias circuits 308 and 318 respectively in FIG. 3. First bias circuit 308 consists of NFET device M5 connected between nodes TAIL1 and ground, and is controlled by signal BIAS1 at its gate terminal to produce a current I1 in differential stage 306. Second bias circuit 318 consists of NFET device M6 connected between nodes TAIL2 and ground, and is controlled by signal BIAS2 at its gate terminal to produce a current I2 in differential stage 316. Output loads 101 and 111 from FIG. 1 are implemented as 301 and 311 respectively in FIG. 3. Load 301 consists of resistors R1 and R2 connected between VDD and OUTN (R1) and VDD and OUTP (R2). Load 311 consists of resistors R3 and R4 connected between VDD and OUTN (R3) and VDD and OUTP (R4). In the example in FIG. 3, output comparator 125 from FIG. 1 is implemented as comparator 325 that has output COMPOUT. In the example in FIG. 3, bias control circuit 124 from FIG. 1 is implemented as bias control circuit 324 with a switched capacitor mechanism. Bias control circuit 324 consists of current balancer 350, calibration logic block 360, and switched capacitor circuit block 370.

The current balancer 350 consists of current source 351 connected between VDD and BIAS1 which generates aggregate current I3=I1+I2, a replica current source transistor M8 which is a copy of transistor M6, and a current mirror transistor M7 which is a copy of transistor M5. The drains of transistors M7 and M8 are connected to the output of current source 351 and the gates of transistor M7, thus controlling node BIAS1. The gate of transistor M8 is connected to node BIAS2 which is controlled by switched capacitor circuit block 370. The source terminals of transistors M7 and M8 are connected to ground. As can be readily recognized by one skilled in the art, the arrangement of current balancer 350 is such that the sum of the currents I1 and I2 is maintained at a value approximately equal to current I3, thereby maintaining the aggregate common mode of the system.

Calibration logic block 360 consists of combinatorial digital logic circuits (not shown but well known in the art) arranged to process the control signals for offset cancellation. Calibration logic block 360 has inputs COMPOUT, CLK, and CAL, and has outputs ADD, SUB, RSTHI, RSTLO, and RESET.

Switched capacitor circuit block 370 consists of switches S1, S2, S3, S4, and S5, capacitors C1, C2, and C3, transistors M9, M10, and M11, and current sources 352, 353, and 354. Switched capacitor circuit block 370 has input signals ADD, SUB, RSTHI, RSTLO, and RESET, and produces output signal BIAS2. Switch S1 is connected between nodes BIAS2 and VHI, and is controlled by signal ADD such that switch S1 is closed when ADD is asserted. Switch S2 is connected between nodes VHI and BIASHI, and is controlled by signal RSTHI such that switch S2 is closed when RSTHI is asserted. Switch S3 is connected between nodes BIAS2 and VLO, and is controlled by signal SUB such that switch S3 is closed when SUB is asserted. Switch S4 is connected between nodes VLO and BIASLO, and is controlled by signal RSTLO such that switch S3 is closed when RSTLO is asserted. Switch S5 is connected between nodes BIAS2 and BIASREF, and is controlled by signal RESET such that switch S5 is closed when RESET is asserted. Capacitor C1 is connected between nodes BIAS2 and ground. Capacitor C2 is connected between nodes VHI and ground, and has a capacitance value which is smaller than that of capacitor C1. Capacitor C3 is connected between nodes VLO and ground, and has a capacitance value is comparable to that of capacitor C2 and lower than that of capacitor C1. The ratios of capacitance of C2 and C3 with respect to C1 determine the quantization level of the system. Hence, as the ratios of capacitance of C2 and C3 with respect to C1 are reduced, the quantization error of the system with regard to offset is reduced, and the system becomes more accurate. However, as the ratios of capacitance of C2 and C3 with respect to C1 are reduced, the number of steps required to effectively cancel offset is increased, increasing the amount of time required to complete the offset cancellation. Transistor M9 is arranged with its source terminal connected to ground and its gate and drain terminals connected together at node BIASHI. Transistor M9 is designed to have a width-to-length (W/L) ratio which is less than the W/L ratio of transistor M6. For example, transistor M9 may be designed to have the a W/L ratio equal to half of the W/L ratio of transistor M6, such that the current in transistor M9 is equal to half of the current in transistor M6 when the gates of M6 and M9 are at the same potential. Transistor M10 is arranged with its source terminal connected to ground and its gate and drain terminals connected together at node BIASLO. Transistor M10 is designed to have a width-to-length (W/L) ratio which is greater than the W/L ratio of transistor M6. For example, transistor M10 may be designed to have the a W/L ratio equal to twice the W/L ratio of transistor M6, such that the current in transistor M10 is equal to twice the current in transistor M6 when the gates of M6 and M10 are at the same potential. Transistor M11 is arranged with its source terminal connected to ground and its gate and drain terminals connected together at node BIASREF. Transistor M11 is designed to have a width-to-length (W/L) ratio which is the same as the W/L ratio of M6, such that the current in transistor M11 is approximately equal to the current in transistor M6 when the gates of M6 and M11 are at the same potential (for example, when switch S5 is closed). Current source 352 is connected between VDD and BIASHI, and produces a current I4. Current source 353 is connected between VDD and BIASLO, and produces a current I5. Current source 354 is connected between VDD and BIASREF, and produces a current I6. Currents I4, I5, and I6 are chose to each be equal to approximately half of the current I3 produced by current source 351. As is apparent to one skilled in the art, the arrangement of transistors M9, M10, and M11, and current sources 352, 353, and 354 causes the voltage of node BIASLO to be less than that of BIASREF, which is in turn less than the voltage of node BIASHI. It is also noted that within the bias circuitry shown in FIG. 3, ratios of transistors sizes and strengths or current source currents may be modified in order to optimize the area, power, and accuracy consumed by the system.

In an exemplary embodiment, calibration logic block 360 may contain circuitry which, when the input signal CAL is asserted, runs an offset cancellation procedure for a fixed number of cycles of the input clock signal CLK. When the offset cancellation procedure is executed, inputs INN and INP may be disconnected from functional circuitry and connected to the same potential, for example, by a multiplexer circuit (not shown). Alternately, the offset cancellation procedure may be executed at a time when the functional inputs INN and INP are known to be at an equal potential. Calibration logic block 360 may contain a memory element such that the signal RESET is asserted at the beginning of the initial execution of the offset cancellation procedure. The assertion of RESET causes switch S5 to close, which charges BIAS2 to the same potential as BIASREF, which in turn causes the current balancer to set BIAS1 to approximately the same potential as BIAS2 and BIASREF, which ultimately results in currents I1 and I2 both being approximately equal to half of current I3. The signal RESET is then de-asserted and the offset cancellation procedure continues. On each subsequent cycle of CLK, the calibration logic block 360 may begin an offset cancellation step by asserting the signals RSTHI and RSTLO during the phase when CLK is asserted. The assertion of RSTHI and RSTLO causes switches S2 and S4 in switched capacitor circuit block 370 to be closed, thereby charging node VHI to the same potential as BIASHI, and charging node VLO to the same potential as BIASLO. Then the polarity of the offset is determined as indicated by the signal COMPOUT which is the output from comparator 325. Based on the offset polarity, when CLK is subsequently de-asserted, the calibration logic block 360 may de-assert signal RSTHI or RSTLO and assert signal ADD or SUB. If the polarity of the input offset is determined to be positive, then during the next phase that CLK is de-asserted, the signal RSTHI is de-asserted and the signal ADD is asserted, resulting in charge-sharing between capacitors C1 and C2 which increases the voltage of node BIAS2 by an amount which is proportional to the ratio of the capacitance of C2 with respect to C1 and proportional to the difference between the voltages of nodes BIASHI and BIAS2. If the polarity of the input offset is instead determined to be negative, then during the next phase that CLK is de-asserted, the signal RSTLO is de-asserted and the signal SUB is asserted, resulting in charge-sharing between capacitors C1 and C3 which decreases the voltage of node BIAS2 by an amount which is proportional to the ratio of the capacitance of C3 with respect to C1, and is proportional to the difference between the voltages of nodes BIASLO and BIAS2. The offset cancellation procedure continues with subsequent steps until either a fixed number of cycles of CLK have elapsed, or the polarity of the offset changes, indicated by a change in the state of signal COMPOUT, which indicates that the offset has been cancelled within the quantization of the system. In the case that the inputs INN and INP have been disconnected from their functional source during offset cancellation, the inputs INN and INP are then reconnected to the functional input source. Finally, the system is returned to functional operation.

One skilled in the art would recognize that switched capacitor block 370 of FIG. 3 is an example of a digital-to-analog converter (DAC), and that other means of effecting a possible bias generation may be substituted, which may include other types of DACs, for example, current-steering DACs, without departing from the spirit and scope of the present invention. Further, one skilled in the art would recognize that the illustration of FIG. 3 may be augmented to provide a means of compensating for or negating capacitor leakage during functional mode which may consist of capacitor multiplexing, timed recalibration, or other known means, without departing from the spirit and scope of the present invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A differential system with offset cancellation comprising:
   a first and a second input;
   a first differential stage, asymmetric in a first direction, for receiving the first and second inputs and generating a first portion of an output;
   a second differential stage, asymmetric in a second direction, for receiving the first and second inputs and generating a second portion of the output;
   a calibration circuit for sampling the output in a calibration mode and biasing at least one of the first and second differential stages to set the output to a target value; and
   a current balancer which biases at least one of first and second differential stages to maintain a common mode of the system.

2. A differential system with offset cancellation comprising:
   a first and a second input;
   a first differential stage, asymmetric in a first direction, for receiving the first and second inputs and generating a first portion of an output;
   a second differential stage, asymmetric in a second direction, for receiving the first and second inputs and generating a second portion of the output;
   a calibration circuit for sampling the output in a calibration mode and biasing at least one of the first and second differential stages to set the output to a target value; and
   a comparator, the comparator is responsive to the output and directs the calibration circuit to bias at least one of first and second differential stages to set the output to the target value.

3. A method of offset cancellation in a differential system of a semiconductor circuit, the method comprising:
   connecting a first and a second input to a differential system;
   coupling the differential system to an equi-potential source during a calibration mode;
   comparing a true and a compliment output of the differential system to determine the direction of the offset in the calibration mode; and
   determining a plurality of bias values of the differential system which substantially cancels the offset in both the calibration mode and a functional mode using a computer.

4. The method of claim 3, wherein the bias values are reset upon initialization of the calibration mode.

5. The method of claim 3, further comprising:
   adjusting the bias of at least one differential stage in the differential system in response to the output such that the offset is cancelled.

* * * * *